United States Patent [19]
Carlson et al.

[11] 3,991,228
[45] Nov. 9, 1976

[54] DEPOSITION OF TIN OXIDE FILMS ON GLASS

[75] Inventors: David Emil Carlson, Yardley, Pa.; Chester Edwin Tracy, Skillman, N.J.

[73] Assignee: RCA Corporation, New York, N.Y.

[22] Filed: Jan. 27, 1975

[21] Appl. No.: 544,569

[52] U.S. Cl. .............................. 427/39; 427/109; 427/166; 204/164
[51] Int. Cl.² .................................... B05D 3/06
[58] Field of Search ............... 427/38, 39, 43, 109, 427/166, 203, 205, 259, 266; 204/164

[56] References Cited
UNITED STATES PATENTS

| | | | |
|---|---|---|---|
| 2,927,042 | 3/1960 | Hall et al. .............................. | 427/38 |
| 3,879,183 | 4/1975 | Carlson .............................. | 204/164 |

FOREIGN PATENTS OR APPLICATIONS

| | | | |
|---|---|---|---|
| 14,600 | 5/1970 | Japan .............................. | 427/39 |

OTHER PUBLICATIONS

Wallis et al., "Journal of Applied Physics", vol. 40, No. 10, Sept. 1969, pp. 3946–3949.

*Primary Examiner*—John H. Newsome
*Attorney, Agent, or Firm*—Glenn H. Bruestle; Birgit E. Morris; Carl L. Silverman

[57] ABSTRACT

Applying a D. C. glow discharge to a heated glass substrate in an evacuated chamber to which certain amounts of oxygen and a volatile tin composition have been added, produces a glass substrate coated with a transparent, conductive coating of tin oxide wherein the surface region of the glass beneath the coating has been depleted of alkali metal ions.

6 Claims, 1 Drawing Figure

U.S. Patent
Nov. 9, 1976
3,991,228
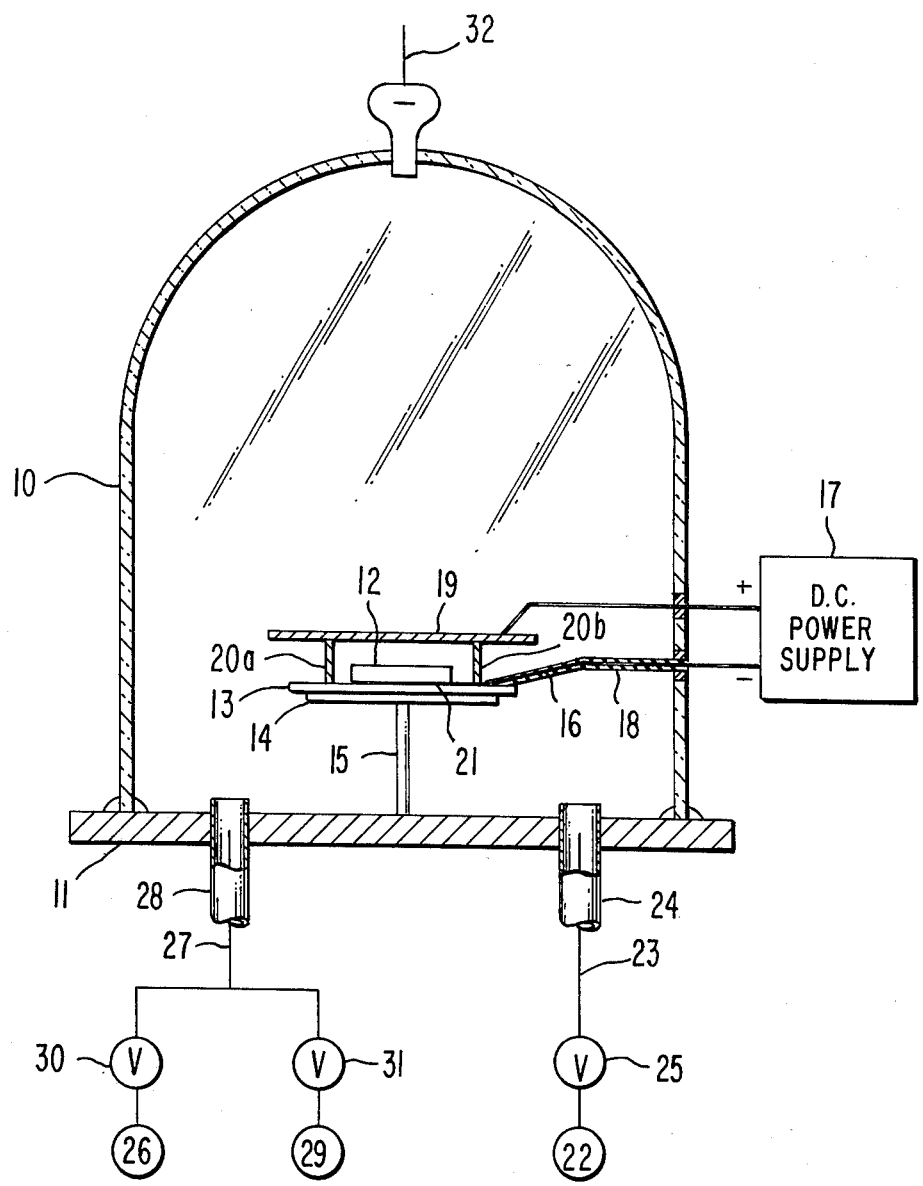

DEPOSITION OF TIN OXIDE FILMS ON GLASS

This invention relates to a method of depositing tin oxide coatings on glass substrates. More particularly, this invention relates to a method of depositing transparent, conductive tin oxide films on glass in a D.C. glow discharge.

BACKGROUND OF THE INVENTION

The deposition of thin, transparent, conductive metal oxide films on glass or quartz substrates has been practiced commercially for some years. In general, commercial processes apply such films by spraying reactive metal compounds, such as tin tetrachloride, onto a hot substrate in the presence of oxygen. However, these films are not conductive enough or uniform enough for certain applications. Thus, other methods of applying the films have also been tried.

Chemical vapor deposition processes are useful, but they require high temperatures and high melting substrates and they are expensive. Further, the films are not as conductive as films applied by other means.

Sputtering processes can apply uniform metal oxide coatings, but such processes are even more expensive and high-quality glasses must be used as substrates.

One application for transparent, conductive metal oxide films on glass which is of increasing importance is their use in liquid crystal cells. These cells basically comprise two metal oxide-coated glass electrodes with a layer of liquid crystal material between them. The metal oxide films must be highly conductive and transparent for good cell contrast. Further, the glass substrates must also be of high quality to prevent impurities such as alkali metal ions from migrating into the liquid crystal material during operation, where they have an adverse effect on the alignment and lifetime of such cells.

Recently, it has been found that inexpensive soda glasses can be treated with a corona discharge to deplete the surface of the glass of alkali metal ions. For applications such as liquid crystal cells, this ion depletion substantially upgrades the surface region of inexpensive glasses and allows one to use inexpensive glass for the cell electrodes, with concomitant economies. The removal of alkali metal ions from the glass surface which is to be coated allows conductive films of improved quality and uniformity to be deposited.

Stockdale et al., in a copending application Ser. No. 371,608, filed June 20, 1973, now abandoned, have disclosed a method whereby a surface of an inexpensive soda-lime-silicate glass is first ion depleted by exposing the glass to a corona discharge and then a conductive metal oxide film is applied by conventional spray techniques. It would be desirable however, to be able to apply improved metal oxide coatings onto the ion depleted glass by a one-step technique providing it would not have an adverse effect on the glass surface to be coated.

SUMMARY OF THE INVENTION

We have found that inexpensive alkali metal-containing glasses can be ion depleted and surface coated with conductive, transparent tin oxide films at the same time under proper conditions in a D.C. glow discharge. According to the novel method, a glow discharge is applied to heated glass substrates in an evacuated chamber containing small amounts of a tin composition and oxygen. The resultant high quality films exhibit improved thermal stability.

BRIEF DESCRIPTION OF THE DRAWINGS

The sole FIGURE is a schematic diagram of an apparatus useful for applying conductive metal oxide films onto a substrate and concurrently ion depleting the surface of the substrate.

DETAILED DESCRIPTION OF THE INVENTION

According to the present process, high quality tin oxide coatings can be applied to a glass substrate by heating the glass substrate within a temperature range of from about 200° to 450° C., but below the softening temperature of the glass, in a vacuum chamber, adding oxygen and a volatile tin composition and applying a D.C. glow discharge to the glass at a current density of from about 0.10 to about 0.55 mA/cm$^2$ for a period of about 15 seconds to about 3 minutes to form a high quality transparent, conductive, tin oxide coating on the now ion-depleted surface of the glass substrate.

Tin compositions useful herein contain volatile tin compounds which vaporize in a vacuum and which can react with oxygen under the conditions specified hereinafter to form tin oxide. Suitable tin compounds include tin tetrachloride, tin tetrabromide, tetramethyl tin and the like. When a dopant for the tin oxide coating is desired, such as an antimony-doped tin oxide film, a dopant gas can also be added as part of the tin composition. The dopant gas also must be vaporizable in a vacuum and reactive with oxygen.

The ratio by volume of oxygen to the tin composition employed can vary widely and is dependent upon the nature of the tin compound employed, the presence or absence of dopant gases, the substrate temperature and the like. In general, a volume ratio of from about 15:1 to about 1:1 of oxygen to tin composition can be employed. The optimum ratio for particular tin compositions and reaction conditions can readily be determined by one skilled in the art by a series of test runs. As illustrations, when tetramethyl tin is employed and the substrate temperature is about 400° C., a volume ratio of from about 15:1 to about 5:1 of oxygen to the tin composition is suitable; however, ratios by volume between about 9:1 to about 6:1 are preferred for highly conductive films; when tin tetrachloride is employed as the tin compound, a volume ratio of from about 4:1 to about 1:1 of oxygen to tin composition is preferred. In general, if the amount of tin composition added is increased, the deposited films increase in thickness and become yellow in color.

Referring now to the FIGURE, the reactions are carried out in a vacuum chamber 10 which is sealed to a baseplate 11. The glass substrate 12 to be coated, is mounted on an insulating platform 13 heated by a heater 14. The heater 14 is supported by a fused silica pedestal 15. The substrate 12 also acts as the cathode during glow discharge and is connected to the negative lead 16 of a high voltage D.C. power supply 17, capable of supplying a current of about 0.5 mA/cm$^2$ and having a voltage rating of about 1 kV. The negative lead 16 is suitably a thin coated platinum wire which is shielded with a fused silica tubing 18 in those portions not in contact with the substrate 12. A metal sheet 19, which acts as the anode during glow discharge, is connected to the positive lead of the power supply 17 and is positioned parallel to and about 2 cm above the glass substrate 12 by means of ceramic spacers 20a and 20b.

The metal sheet 19 is preferably perforated and can be a conductive metal grid or screen, as of steel, aluminum, platinum and the like. The substrate 12 is coated on the side away from the anode 19 with a conductive coating 21, as of silver or graphite, so that current is passed through the glass substrate 12 during glow discharge. By applying a high voltage to the electrodes 12 and 19, a glow discharge is produced between them.

The vacuum chamber 10 can be evacuated by an evacuating pump 22 connected by means of an exit line 23 through an exit port 24 of the baseplate 11 and is monitored by a valve 25.

A storage unit 26 for the volatile tin compound is connected to the vacuum chamber 10 by means of a feed line 27 to the inlet port 28 through the baseplate 11. A storage unit 29 for oxygen is also connected to the feed line 27. The relative amounts of the volatile tin compound and oxygen fed to the vacuum chamber 10 is monitored by valves 30 and 31 respectively. In the case where dopant gases are also fed to the vacuum chamber 10, they can be connected to the feed line 27 in like manner. The pressure inside the vacuum chamber 10 is monitored by means of a gauge 32, which can be a thermocouple vacuum gauge or a McLeod gauge.

It will be understood that various modifications of the above-described apparatus can be made. In the event the vacuum chamber 10 can be mounted in a furnace, the heater 14 is unnecessary. In that event, the glass substrate 12, when properly mounted and shielded, can be contacted by glow discharge on both sides. The surface adjacent to the positive electrode 19 will be coated with tin oxide and ion depleted.

In using the above apparatus to deposit tin oxide films, the vacuum chamber 10 is first evacuated by means of the evacuating pump 22 to its ultimate pressure while heating the glass substrate 12 to the desired temperature with the heater 14. Suitable temperatures can be from about 200° C. up to the softening temperature of the glass, but preferably is below about 400° C. When a volatile organic tin compound, such as tetramethyl tin, is employed, lower temperatures can be employed than for an inorganic tin compound because the glow discharge dissociates the molecules and drives the positive tin ions to the surface of the cathode 12 under high energy. However, as the temperature of deposition increases, the tin oxide films become more durable. Thus the temperature will be chosen depending upon the properties desired. The valve 25 connected to the vacuum pump 22 is then shut off and the volatile tin composition is bled into the vacuum chamber 10 by means of the valve 30 through the feed line 27 up to the desired pressure as measured by the gauge 32. The desired amount of oxygen is then added by means of the valve 31 also through the feed line 27. The final vapor pressure in the vacuum chamber 10 is suitably from about 0.5 to about 2.0 torr, preferably below about 1.0 torr.

The current is then turned on. A current density between about 0.10 to about 0.55 mA/cm$^2$ should be maintained. The current density in general is directly proportional to the rate of deposition of the tin oxide film. Excellent films about 1000 Angstroms thick can be deposited in about 1 minute when the current density is about 0.5 mA/cm$^2$ in a pressure of about 1 torr. If the current density is too low, the resistivity of the resultant film is high. However, if the current density is too high, a rapid increase in surface resistivity occurs also, probably due to increased sputtering which causes a decrease in film thickness, and which in turn ultimately results in removal of the tin oxide film.

The minimum voltage for deposition can be determined by adjusting the applied voltage so that the glow of the discharge just covers the entire surface of the substrate to be coated. Operation near the minimum voltage assures uniform tin oxide deposition while minimizing sputtering effects. The applied voltage may be increased during deposition if required. In the case where high alkali-containing glasses are employed as substrates, as the surface being coated becomes ion depleted, its resistance also increases and a higher applied voltage may be required for continued deposition.

The current is maintained for from about 15 seconds to about 3 minutes, depending on the amount of current, to deposit films of the proper thickness, generally from about 700 to 1500 Angstroms. When the proper film thickness is obtained, the glow is extinguished.

As is known, the addition of minimum amounts of antimony to tin oxide coatings decreases the resistivity of the films. Thus, if desired, a small amount of a volatile antimony compound, such as antimony pentachloride, can be added to the vacuum chamber as a portion of the volatile tin composition. Although the exact amount of antimony present is not critical, a ratio by volume of at least about 10% of the antimony to the tin compound is desirable in order to achieve a substantial decrease in resistivity of the resultant film.

When the tin oxide coating is to be applied in a patterned configuration, a suitable mask can be placed over the exposed surface of the glass substrate 12.

By adjustment of the tin-composition-to-oxygen ratio, substrate temperature, current density and deposition time, excellent tin oxide films about 1000 Angstroms thick, having high light transmission, on or the order of 85% or higher, and low electrical resistivity, on the order of 200–500 ohms/square, can be readily achieved using the present process, while at the same time the surface region beneath the coating for about 1000 Angstroms or more in depth is substantially depleted of alkali metal ions. The resultant films have improved thermal stability over films deposited by the Stockdale el al. process referred to hereinabove. While the resistivity of tin oxide films produced according to the present process increases only about 10–20% after exposure to an elevated temperature for prolonged periods, the resistivity of films produced by the prior art process employing an ion depletion step followed by a tin chloride spray on the hot glass increased by a factor of 2 or more after baking for ½ hour at 450° C.

The invention will be further illustrated by the following Examples, but it is to be understood that the invention is not meant to be limited to the details described therein.

Example 1

In a vacuum chamber, as in the FIGURE, a soda-lime-silicate glass plate having a glass composition of about 73% $SiO_2$, 13.5% $Na_2O$, 9% CaO, 4% MgO, and 0.2% $Al_2O_3$, all percents by weight, was mounted as the cathode and a perforated cold-rolled steel plate about 2 cm above and parallel to the plate was mounted as the anode. The vacuum chamber was evacuated to a pressure of about 10 microns of air while heating the glass plate to a temperature of about 390° C. Tin tetrachloride vapor was added to the chamber to a reading of 250 microns on a thermocouple pressure gauge calibrated for air and then oxygen was added to a reading of 500 microns.

A voltage of 700 volts was applied such that about 400 volts was passed across the gap between the anode and the cathode and about 300 volts passed across a $10^5$ ohm limiting resistor to prevent arcing. The current density was maintained at a constant level of 0.19 mA/cm$^2$ for a deposition time of 2 minutes.

A coating of tin oxide was deposited on the glass plate, while at the same time the glass surface under the coating was ion depleted to a depth of about 2300 Angstroms. The tin oxide film had a thickness of about 800 Angstroms, an average transmission of visible light of about 85% compared to a sample of the uncoated glass as a control, a surface resistivity of 410 ohms per square and a bulk resistivity of about $3.3 \times 10^{-3}$ ohm-cm.

The coated glass plate was baked in air for about 45 minutes at 450° C. The resistivity increased by only about 20%.

Examples 2–6

The procedure of Example 1 was followed except that the glass substrates were heated to about 400° C. using tetramethyl tin as the tin source. The amount of tetramethyl tin was varied and the effect on surface resistivity and film thickness noted. The results are tabulated below in Table I. The pressures in the vacuum chamber were measured with a McLeod gauge. The total pressure was about 0.8 torr. Film thickness was measured with a stylus profilometer.

| Example | Pressure Reading After Addition of Sn(CH$_3$)$_4$, Microns | Ratio by Volume of Oxygen :Sn(CH$_3$)$_4$ | Surface Resistivity, Ohms/Square | Film Thickness, Angstroms |
|---|---|---|---|---|
| 2 | 72 | 10:1 | 4500 | 350 |
| 3 | 79 | 9.1:1 | 1030 | 450 |
| 4 | 104 | 6.7:1 | 900 | 500 |
| 5 | 121 | 5.6:1 | 8000 | 650 |
| 6 | 148 | 4.4:1 | 100,000 | 1250 |

Referring to Example 4, the average transmission was about 90% and the surface of the glass was ion depleted to a depth of about 2300 Angstroms.

After baking in air at 450° C. for 45 minutes, the resistivity increased only about 14%.

It is apparent that when the ratio of oxygen to tetramethyl tin is between about 9:1 to about 6:1, the film resistivity is minimized.

Example 7

The procedure of Example 2 was followed except that the glass plate was heated to 214° C., tetramethyl tin was added to a thermocouple gauge reading of 280 microns and oxygen to a second reading of 600 microns. The current density was maintained at 0.18 mA/cm$^2$.

The resultant tin oxide coating was about 2000 Angstroms thick, yellow in color, the average transmission was about 80% and the film had a surface resistivity of 1.3 kilo-ohms per square.

Examples 8–11

The procedure of Example 3 was followed except the glass plate was heated to 350° C. and antimony pentachloride was fed into the vacuum chamber first in varying amounts. Tetramethyl tin was then added to a McLeod gauge reading of 150 microns and oxygen was added to a new reading of 1.5 torr.

The resultant antimony-doped tin oxide films were about 700 Angstroms thick, had a slightly blue color with an average transmission of about 85%. The variations in resistivity with antimony content are noted in Table II below:

TABLE II

| Ex. | Pressure Reading After SbCl$_5$ Addition, Microns | Ratio of SbCl$_5$ :Sn(CH$_3$)$_4$ | Surface Resistivity, ohms/sq. | Bulk Resistivity, ohms-cm |
|---|---|---|---|---|
| 8 | 20 | 0.07:1 | 415 | $5.3 \times 10^{-3}$ |
| 9 | 30 | 0.11:1 | 212 | $2.3 \times 10^{-3}$ |
| 10 | 45 | 0.016:1 | 200 | $2.0 \times 10^{-3}$ |
| 11 | 70 | 0.28:1 | 190 | $1.7 \times 10^{-3}$ |

Thus, the antimony-doped films are increasingly conductive as the amount of antimony is increased.

Examples 12–16

The procedure of Example 2 was followed except that the glass plate was heated to about 350° C., deposition time was about 30 seconds and the current density was varied. The variation of resistivity with current density can be seen from Table III below:

TABLE III

| Example | Current Density, mA/cm$^2$ | Resistivity, ohms/sq. |
|---|---|---|
| 12 | .07 | 50,000 |
| 13 | .18 | 10,000 |
| 14 | .35 | 1500 |
| 15 | .52 | 900 |
| 16 | .70 | 170,000 |

We claim:
1. A method of depositing transparent, conductive films of tin oxide on a glass substrate which comprises:
   a. heating said glass substrate to a temperature in the range of from about 200° C. to below the softening temperature of the glass in an evacuated chamber,
   b. adding oxygen and a volatile tin composition to a partial pressure up to about 2.0 torr so that the volume ratio of the vapors is from about 15:1 to about 1:1 of oxygen to the tin composition,
   c. applying a D.C. glow discharge between two electrodes situated in said chamber, the cathode of which is said glass substrate, at a current density of from about 0.10 to about 0.55 mA/cm$^2$ for a period of about 15 seconds to about 3 minutes, so that said glass substrate becomes simultaneously coated with a tin oxide film and a surface region beneath said coating becomes depleted of alkali metal ions.
2. A method according to claim 1 wherein the glass is a soda-lime-silicate glass.
3. A method according to claim 1 wherein the tin composition contains tetramethyl tin and the ratio by volume of oxygen to the tin composition is from about 9:1 to about 6:1.
4. A method according to claim 1 wherein the tin composition contains tin tetrachloride and the volume of oxygen to the tin composition is from about 4:1 to about 1:1.
5. A method according to claim 3 wherein the tin composition contains antimony pentachloride.
6. A method according to claim 1 wherein the tin oxide film is from about 700 to about 1500 Angstroms thick.

\* \* \* \* \*